(12) United States Patent
Tiruvuru

(10) Patent No.: US 8,253,614 B1
(45) Date of Patent: Aug. 28, 2012

(54) ANALOG-TO-DIGITAL CONVERSION METHODS AND SYSTEMS

(75) Inventor: Rajesh Tiruvuru, Singapore (SG)

(73) Assignee: Marvell International Ltd., Hamilton (BM)

( * ) Notice: Subject to any disclaimer, the term of this patent is extended or adjusted under 35 U.S.C. 154(b) by 133 days.

(21) Appl. No.: 12/832,352

(22) Filed: Jul. 8, 2010

Related U.S. Application Data

(60) Provisional application No. 61/238,895, filed on Sep. 1, 2009.

(51) Int. Cl.
*H03M 1/12* (2006.01)
(52) U.S. Cl. .......................... 341/155; 341/161
(58) Field of Classification Search .................. 341/155, 341/120, 118, 161–163
See application file for complete search history.

(56) References Cited

U.S. PATENT DOCUMENTS

| | | | | |
|---|---|---|---|---|
| 4,709,225 | A * | 11/1987 | Welland et al. ............... | 341/121 |
| 5,212,486 | A * | 5/1993 | Nagaraj ........................ | 341/172 |
| 7,170,439 | B1 * | 1/2007 | Chen ............................ | 341/172 |
| 7,924,209 | B2 * | 4/2011 | Kuo et al. .................... | 341/172 |

OTHER PUBLICATIONS

Y. Chiu, "High-Performance Pipeline A/D Converter Design in Deep-Submicron CMOS," A dissertation submitted in partial satisfaction of the requirements for the degree of Doctor of Philosophy in Engineering—Electrical Engineering and Computer Sciences in the Graduate Division of the University of California, Berkeley, Fall 2004.
Y. Chiu et al., "A 14-b 12-MS/s CMOS Pipeline ADC with over 100-dB SFDR," *IEEE Journal of Solid-State Circuits*, vol. 39, No. 12, Dec. 2004, pp. 2139-2151.

* cited by examiner

*Primary Examiner* — Brian Young

(57) ABSTRACT

Methods and systems for converting analog signals to digital signal using a cyclic analog-to-digital converter are disclosed. For example, such a cyclic analog-to-digital converter may include digitization circuitry configured to digitize either an input signal or an amplified feedback residue signal to produce first digital signals, digital accumulator circuitry configured to produce N-bits of digital information based on the first digital signals over N consecutive cycles, where N is a positive integer, and a residue amplifier configured to amplify a residue signal to produce the amplified feedback residue signal, wherein for at least M cycles, the residue amplifier operates using a capacitor averaging technique, where M is a positive integer and less than N, and wherein for P cycles the residue amplifier operates using a simple gain amplification technique, where P is a positive integer and less than N.

20 Claims, 5 Drawing Sheets

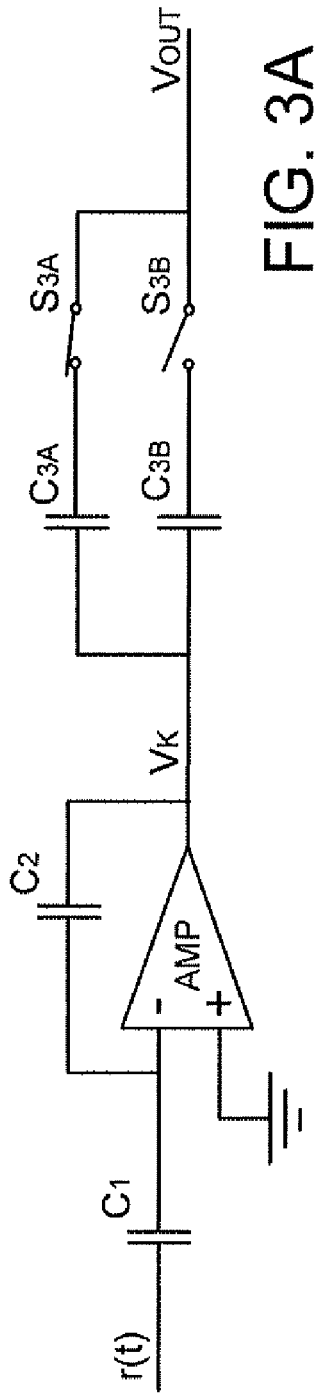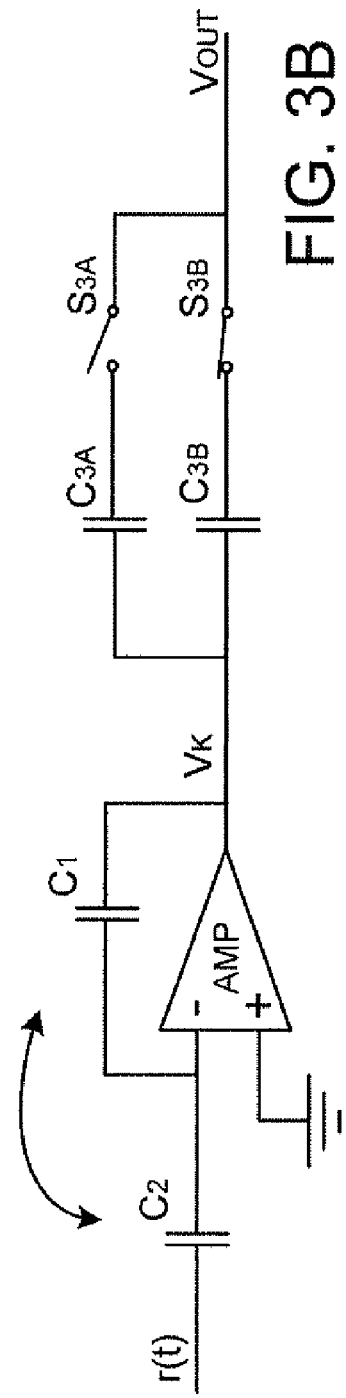

ANALOG-TO-DIGITAL CONVERSION METHODS AND SYSTEMS

INCORPORATION BY REFERENCE

This application claims the benefit of U.S. Provisional Application No. 61/238,895, "An Improved Cyclic ADC Design Technique" filed on Sep. 1, 2009, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of tiling, are neither expressly nor impliedly admitted as prior art against the present disclosure.

Analog-to-Digital Converters (ADCs) are electronic devices that have become a fundamental building block in everything from power supplies to cell phones. One of the challenges to designing ADCs is to assure that their performance meets design requirements, such as conversion speed and accuracy, while being made as inexpensively as possible. One particular type of known ADC is called a pipelined ADC, which uses a series of pipelined stages to digitize signals, for instance, one bit at a time. A variant of the pipelined ADC is known as the cyclic ADC, which applies the general concept of digitizing signals one bit at a time, but uses a single conversion stage with feedback so as to emulate a pipeline. While the cyclic approach takes far longer to convert signals than a pipelined ADC for the same number of bits, there is a proportionate saving in hardware. For example, while a 12-bit cyclic ADC may take twelve times longer to convert a given signal than a 12-bit pipelined converter, the cyclic ADC may use only one-twelfth of the conversion cells required by the pipelined ADC. Unfortunately, both cyclic and pipelined converters are subject to manufacturing constraints, and component mismatch caused by real world manufacturing limitations may cause substantial conversion errors. Accordingly, new technology for compensating for such manufacturing limitations may be desirable.

SUMMARY

Various aspects and embodiments of the invention are described in further detail below.

In an embodiment, a cyclic analog-to-digital converter includes a digitizer circuitry configured to digitize either an input signal or an amplified feedback residue signal to produce first digital signals, an accumulator configured to produce N-bits of digital information based on the first digital signals over N consecutive cycles, where N is a positive integer, and a residue amplifier configured to amplify a residue signal to produce the amplified feedback residue signal, wherein for at least M cycles, the residue amplifier operates using a capacitor averaging technique, where M is a positive integer and less than N, and wherein for P cycles the residue amplifier operates using a simple gain amplification technique, where P is a positive integer and less than N.

In another embodiment, a method for performing analog-to-digital conversion, includes digitizing either an input signal or an amplified feedback residue signal to produce first digital signals, producing N-bits of digital information based on the first digital signals over N consecutive cycles, where N is a positive integer, and amplifying a residue signal to produce the amplified feedback residue signal, wherein for at least M cycles, the step of amplifying may be done using a capacitor averaging technique, where M is a positive integer and less than N, and wherein for P cycles, the step of amplifying may be done using a simple gain amplification technique, where P is a positive integer and less than N.

In yet another embodiment, a cyclic analog-to-digital converter includes a means for digitizing either an input signal or an amplified feedback residue signal to produce first digital signals, a means for producing N-bits of digital information based on the first digital signals over N consecutive cycles, where N is a positive integer, and a means for amplifying a residue signal to produce the amplified feedback residue signal, wherein for at least M cycles, the means for amplifying uses a capacitor averaging technique, where M is a positive integer and less than N, and wherein for P cycles, the means for amplifying uses a gain amplification technique, where P is a positive integer and less than N.

BRIEF DESCRIPTION OF THE DRAWINGS

Various embodiments of this disclosure that are proposed as examples will be described in detail with reference to the following figures, wherein like numerals reference like elements, and wherein:

FIGS. 3A and 3B depict details of the exemplary residue amplifier of FIG. 2,

DETAILED DESCRIPTION OF EMBODIMENTS

The disclosed methods and systems below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
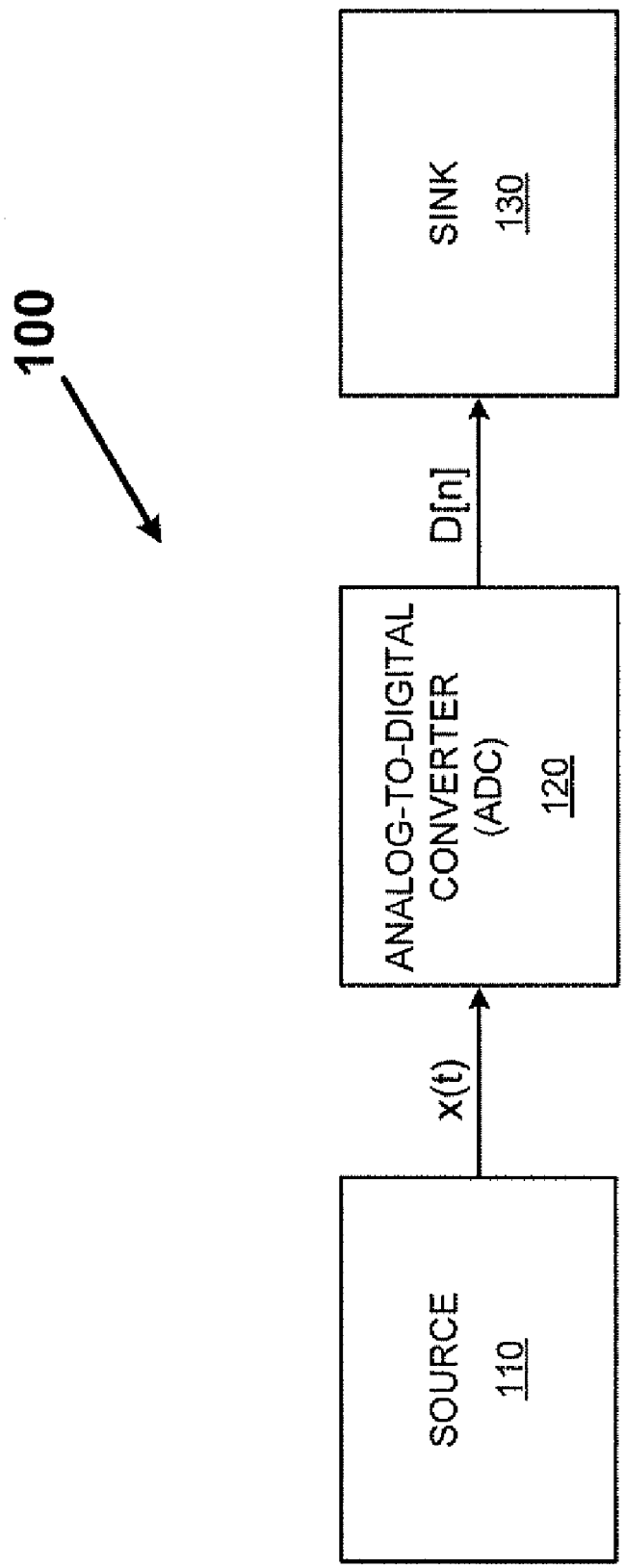
FIG. 1 depicts an exemplary system using an analog-to-digital converter (ADC).

FIG. 1 depicts an exemplary system 100 using an analog-to-digital converter (ADC). As shown in FIG. 1, the system 100 includes an analog signal source 110, an ADC 120 and a digital sink 130. In operation, the analog signal source 110 may transmit an analog signal to the ADC 120. In turn, the ADC 120 may convert the analog signal into a stream of digital signals representing the information of the analog signal, and provide the digital signals to the digital sink 130.

The exemplary analog signal source 110 may be any one of a number of different sources such as an electronic data transmitter, a node in a power supply or other electronic system, a signal derived from an optical transducer or by some other form of transducer, or any other known or later developed device suitable for providing an analog signal. The exemplary digital sink 130, accordingly, may be any one of a number of different devices suitable to receive, monitor or otherwise process digital signals derived from analog information as may be recognized by those skilled in the art.

Figure 2:
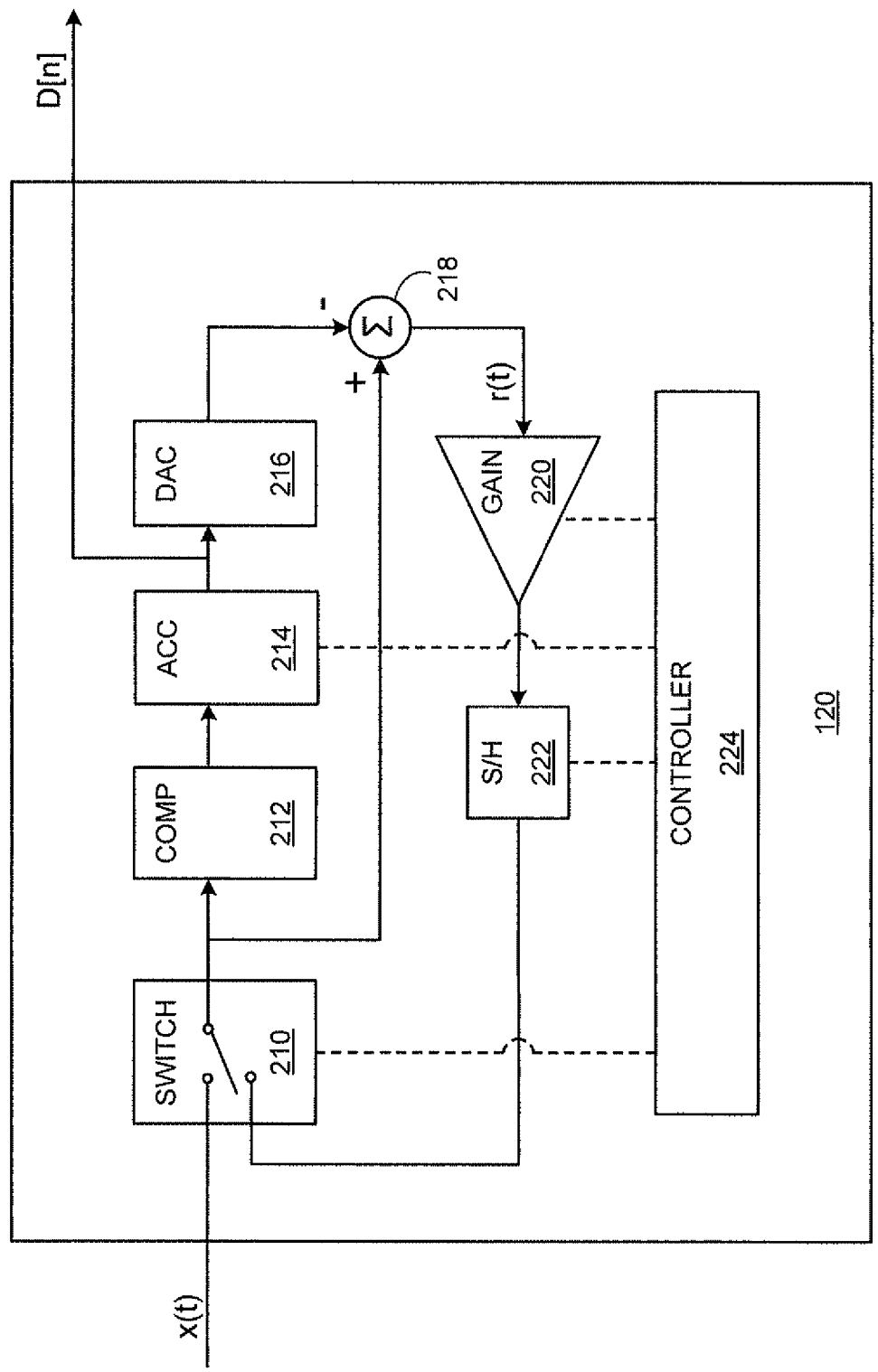
FIG. 2 depicts details of the exemplary ADC of FIG. 1.

FIG. 2 depicts details of the exemplary ADC 120 of FIG. 1, which is but one possible non-limiting embodiment of a cyclic ADC. As shown in FIG. 2, the exemplary ADC 120 includes a switch 210, a comparator/digitizer 212, an accumulator 214, a digital-to-analog converter (DAC) 216, a summing junction 218, a residue amplifier 220, a sample/hold device (S/H) 222, and a timing controller 224.

In operation and under control of the timing controller 224, the switch 210 may be set to allow an analog input signal x(t) to pass to the comparator/digitizer 212. In turn, the comparator/digitizer 212 may perform a 1-bit digitization process on the input signal x(t) to provide a digital signal to the accumulator 214. Upon receiving the digital signal from the comparator/digitizer 212, the accumulator 214, under control of the timing controller 224, may determine a most significant bit (MSB) of N-bits of digital information that the ADC 120 provides to some external device. For example, if the cyclic ADC 120 of FIG. 2 is a 12-bit device (N=12), the accumulator 214 at this point may determine the top MSB leaving the remaining eleven bits for later determination in later conversion cycles.

The output of the accumulator 214 then may be provided to the DAC 216, which may produce an analog signal to the summing junction 218. In turn, the summing junction 218 may subtract the signal provided by the DAC 216 from the signal presented to the comparator/digitizer 212 to produce a residue signal r(t) that is then provided to the input of the residue amplifier 220.

Upon receiving the residue signal r(t), the residue amplifier 220 may amplify the residue signal r(t) by two times, and provide the amplified residue signal to the S/H 222. The S/H 222 (which may alternatively be a track/hold (T/H) or similar signal holding circuit) may then capture the amplified residue signal upon command from the timing controller 224.

Once the amplified residue signal is captured by the S/H 222, the timing controller 224 may then cause the switch 210 to change position so as to feed the captured amplified residue signal to the input of the comparator/digitizer 212. The comparator/digitizer 212, accumulator 214, DAC 216, summing junction 218, residue amplifier 220 and S/H 222 may then cyclically repeat the above described process to produce even finer digital resolution with each cycle in a manner well understood by those skilled in the relevant arts based upon the disclosure and teachings provided herein.

Note that while the general principles of cyclic ADCs are well known, the exemplary ADC 120 may use a modified process in the residue amplifier 220 to improve performance in view of certain practical manufacturing limitations known in wafer processing. In particular, it is known that individual analog components made in wafer processing, such as resistors and capacitors, may have variances from component to component. While such variances may typically be kept to 1%, such differences nonetheless may have substantial detrimental effects on devices such as cyclic ADCs.

In order to compensate for such component variance or mismatch, a technique known as "capacitor averaging" may be used where the roles of two components may be exchanged during two different phases of a given conversion cycle. The benefit of capacitor averaging is that it may alleviate a need to perform extra wafer processing steps, such as laser trimming of capacitors, at the expense of some increased conversion time of a resultant ADC.

For the present disclosure, it is to be appreciated that the technique of capacitor averaging may be applied to the residue amplifier 220. FIGS. 3A and 3B depict details of a capacitor averaging technique that may be used by the exemplary residue amplifier 220 of FIG. 2 for a given conversion cycle. As shown in FIG. 3A, a first configuration for a first capacitor averaging phase (Φ1) is depicted where an operational amplifier AMP employs a first capacitor C1 acting as an input capacitor, and a second capacitor C2 acting as a feedback capacitor. The gain for this configuration may be described as G=−(C1/C2), and the transfer function of the configuration may be described as $V_{K(\Phi1)}$=−(C1/C2)r(t). The output voltage $V_{K(\Phi1)}$ may be captured on capacitor $C_{3A}$ by virtue of the settings of switches $S_{3A}$ and $S_{3B}$.

Continuing to FIG. 3B, a second configuration for a second capacitor averaging phase (Φ2) is depicted where the same operational amplifier AMP and capacitors C1 and C2 are employed, but in this phase the rolls of the capacitors C1 and C2 are exchanged by virtue of a switching network (not shown) so that the second capacitor C2 acts as an input capacitor, and the first capacitor C1 acts as a feedback capacitor. The gain for this configuration may be described as G=−(C2/C1), and the transfer function of the configuration may be described as $V_{K2(\Phi2)}$=−(C2/C1)r(t). The output voltage $V_{K(\Phi2)}$ may be captured on capacitor $C_{3B}$ by virtue of the settings of switches $S_{3A}$ and $S_{3B}$.

Once the respective voltages for phases Φ1 and Φ2 are captured on capacitors $C_{3A}$ and $C_{3B}$, such voltages may be averaged to mitigate the errors, passively by placing the capacitors in parallel for example, or by using any number of active techniques. Further details and examples of capacitor averaging techniques may be found in "A 14 bit, 12MSW/s CMOS Pipeline ADC with over 100-dB SFDR" by Yun Chiu et al., *IEEE J. Solid State Circuits*, vol. 39, pp. 2139-2151, (December 2004), the content of which is incorporated by reference in its entirety.

Figure 4:
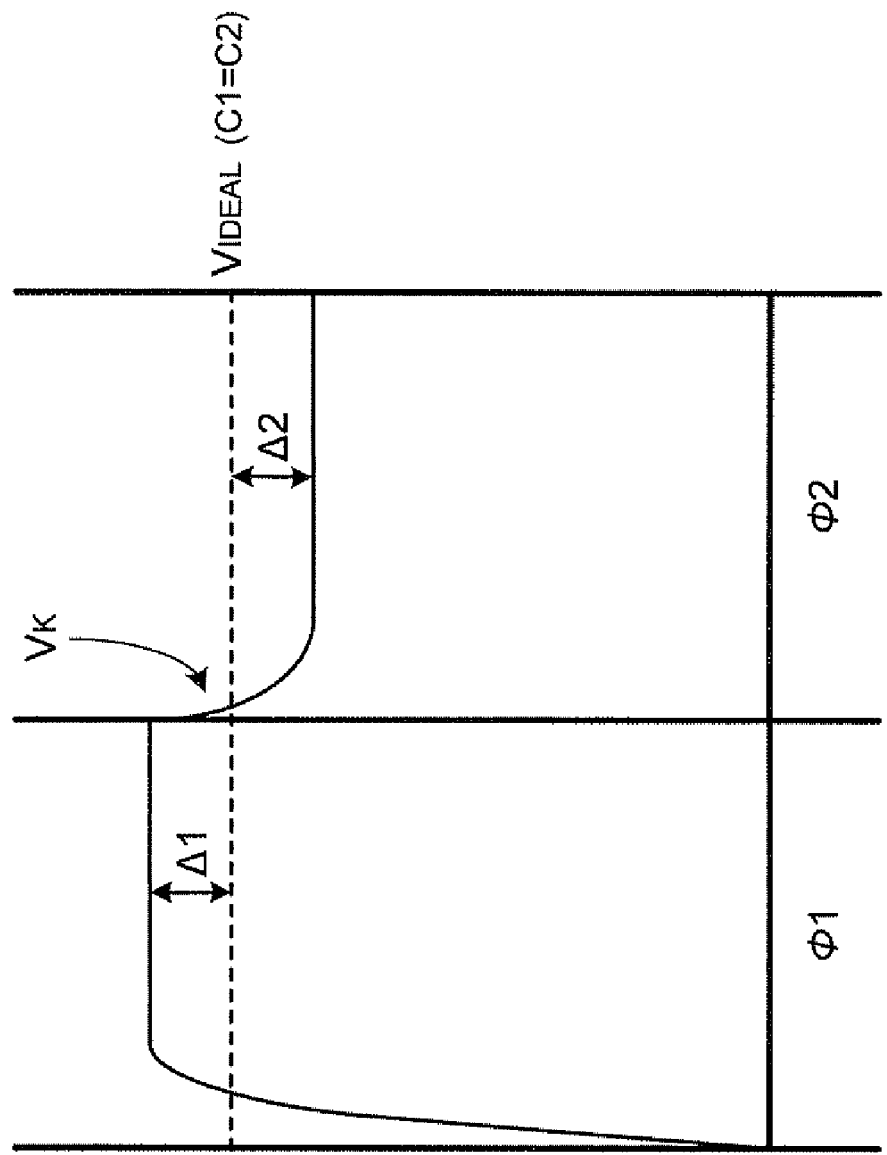
FIG. 4 illustrates the gain transfer function for the operational amplifier depicted in FIGS. 3A and 3B.

FIG. 4 illustrates the gain transfer function for the operational amplifier AMP depicted in FIGS. 3A and 3B. As shown in FIG. 4, during the first gain stage (Φ1), capacitor C1 is assumed to be greater than C2, and the output of amplifier AMP ($V_K$) rises to a level Δ1 above the ideal case (C1=C2), while during the second gain stage (Φ2), the output of amplifier AMP ($V_K$) dips to a level Δ2 below the ideal case. As the magnitudes of Δ1 and Δ2 may be assumed to be very close, it may be apparent that, by combining the information developed during the two phases Φ1 and Φ2, error due to component mismatch may be effectively alleviated as compared to the case of "simple amplification", where the roles of capacitors C1 and C2 remain static, e.g., capacitor C1 is used solely as an input capacitor and capacitor C2 is used as a feedback capacitor.

Returning to FIG. 2, while it may be appreciated that capacitor averaging may improve device performance of the residue amplifier 220, it may be also appreciated that capacitor averaging need not be employed for every one of the N conversion cycles of the ADC 120. That is, it may be beneficial to employ capacitor averaging in the residue amplifier 220 for conversion cycles determining high-order bits, while using a simple gain amplification in the residue amplifier 220 for the latter cycles that determine the least significant bits (LSBs). For example, in various embodiments where 12-bit conversion (N=12) is desired, it may be desirable to employ capacitor averaging in all conversion cycles except those cycles used for the last four to eight LSBs. For example, the inventors of the disclosed methods and systems have determined (by rigorous analysis and simulation) that a 12-bit cyclic ADC may be fabricated with 1% component mismatch that maintains target performance when the first six conversion cycles employ capacitor averaging amplification in a residue amplifier while the remaining six conversion cycles employ simple amplification. For example, assuming that a semiconductor manufacturing facility can produce cyclic ADCs having capacitors with matching tolerances of about 1%, a 12-bit fully functional (e.g., almost no missing codes and no non-monotonicities) cyclic ADC may be designed and manufactured that uses capacitor averaging for the first six conversion cycles that determine MSBs, and simple gain for the last six cycles. Of course, depending on other circumstances, such as the acceptance of some missing codes and non-linearities, the number of simple amplification cycles may vary, e.g., from four to eight cycles.

Figure 5:
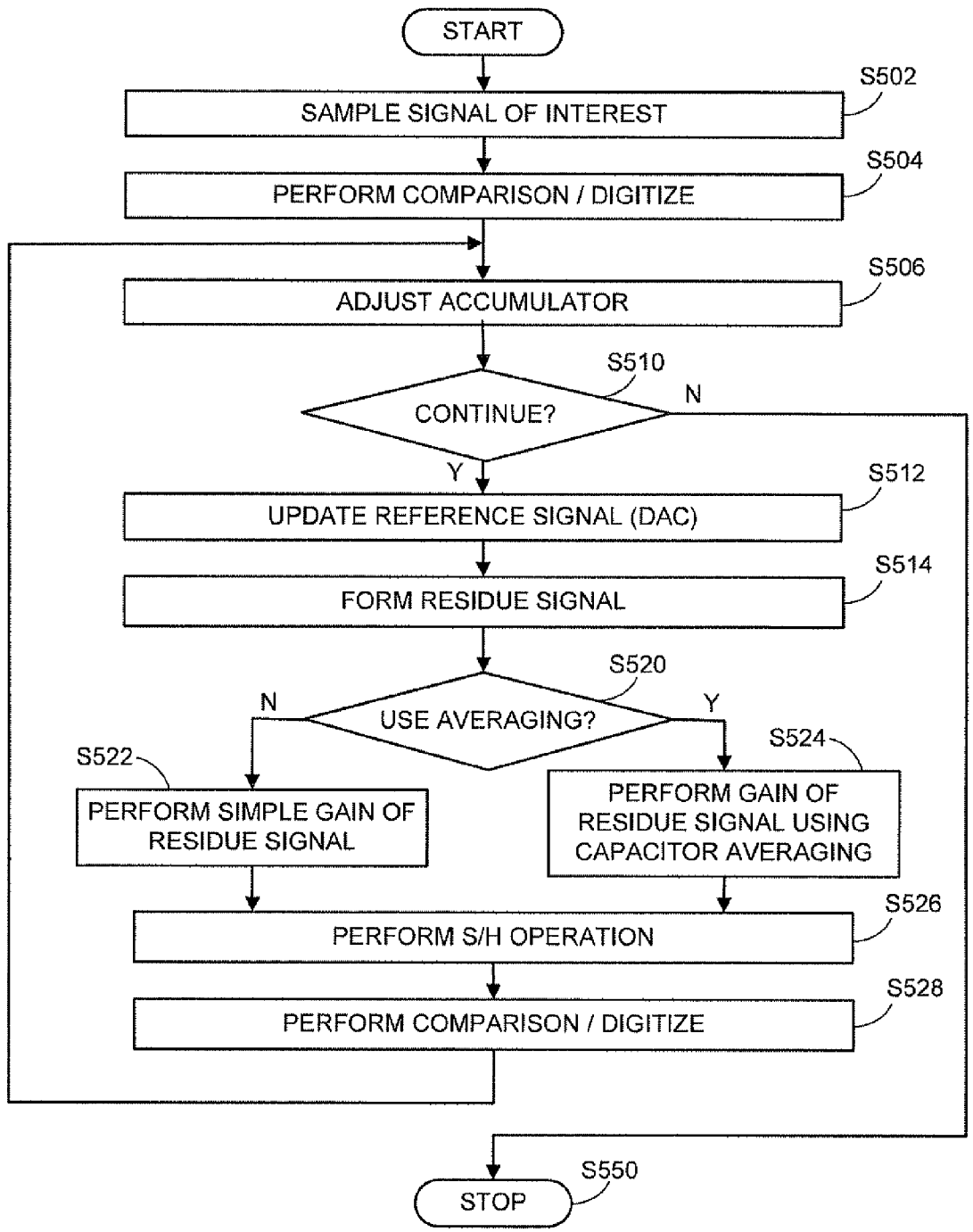
FIG. 5 is a flowchart outlining an exemplary operation of the disclosed methods and systems.

FIG. 5 is a flowchart outlining an exemplary operation of the disclosed methods and systems for performing cyclic ADC conversion. While the below-described steps are described as occurring in a particular sequence for convenience, it is to be appreciated by those skilled in the art that the order of various steps may be changed from embodiment to embodiment. It is further to be appreciated that various steps may occur simultaneously or be made to occur in an overlapping fashion.

The process starts in step S502 where an analog signal of interest may be sampled. Next, in step S504 the sampled signal of step S502 may be digitized to produce a digitized signal. Then, in step S506 an accumulated number may be adjusted to reflect the digitized signal of step S504. Control continues to step S510.

In step S510, a determination may be made as to whether to continue the cyclic conversion process, i.e., enough bits of resolution have been determined. If the digitization process is to continue, control continues to step S512; otherwise, control jumps to step S550 where the process stops.

In step S512, an analog reference signal may be produced from the accumulated number of step S506. Next, in step S514, a residue signal may be produced by subtracting the reference signal of step S512 from the signal used in the digitization process of step S504 (and later for the digitization process of step S528 below). Then, in step S520, a determination may be made as to whether capacitor averaging is to be used to amplify the residue signal. As discussed above, for N-bits of conversion it may be advantageous to use capacitor averaging for first conversion cycles that produce the most significant bits (MSBs), while using simple amplification for the later conversion cycles that determine the LSBs, as such an approach may appropriately compensate for capacitor mismatch while keeping total conversion time to a minimum. If capacitor averaging is to be employed, control continues to step S524; otherwise, control continues to step S522.

In step S522, a simple gain technique may be performed on the residue signal of step S514 to produce an amplified residue signal, and control continues to step S526.

In contrast to step S522, in step S524 a capacitor averaging technique may be performed on the residue signal of step S514 to produce an amplified residue signal, and control continues to step S526.

In step S526 a sample/hold (or alternatively track/hold) operation may be performed on the amplified residue signal, and in step S528 the sampled signal of step S526 may be digitized to produce a digitized signal. Control then jumps back to step S506, where the cyclic conversion process may continue for a total of N steps noting that the MSBs of the conversion process may be developed using the capacitor averaging gain technique of step S524 while the LSBs may developed using simple gain technique of step S522.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. A cyclic analog-to-digital converter, comprising:
    a digitizer configured to digitize either an input signal or an amplified feedback residue signal to produce first digital signals;
    an accumulator configured to produce N-bits of digital information based on the first digital signals over N consecutive cycles, where N is a positive integer; and
    a residue amplifier configured to amplify a residue signal to produce the amplified feedback residue signal,
    wherein for at least M cycles, the residue amplifier operates using a capacitor averaging technique, where M is a positive integer and less than N, and
    wherein for P cycles the residue amplifier operates using a simple gain amplification technique, where P is a positive integer and less than N.

2. The converter of claim 1, wherein the P cycles are used to produce the least significant bits of the N-bits of digital information.

3. The converter of claim 2, wherein P is greater than 4.

4. The converter of claim 3, wherein P is at least 6.

5. The converter of claim 3, wherein P is less than 8.

6. The converter of claim 5, wherein the residue amplifier is manufactured using capacitors having a matching tolerance of about 1%.

7. The converter of claim 2, wherein the residue amplifier is manufactured using capacitors having a matching tolerance of about 1%.

8. The converter of claim 1, further comprising:
    a digital-to-analog converter and a summing junction collectively configured to produce the residue signal; and
    signal holding circuitry coupled to the residue amplifier such that the residue amplifier and signal holding circuitry together produce a delayed amplified residue signal to the digitization circuitry.

9. A method for performing analog-to-digital conversion, comprising:
    digitizing either an input signal or an amplified feedback residue signal to produce first digital signals;
    producing N-bits of digital information based on the first digital signals over N consecutive cycles, where N is a positive integer; and
    amplifying a residue signal to produce the amplified feedback residue signal,
    wherein for at least M cycles, the step of amplifying is done using a capacitor averaging technique, where M is a positive integer and less than N, and
    wherein for P cycles, the step of amplifying is done using a simple gain amplification technique, where P is a positive integer and less than N.

10. The method of claim 9, wherein the P cycles are used to produce the least significant bits of the N-bits of digital information.

11. The method of claim 10, wherein P is greater than 4.

12. The method of claim 11, wherein P is at least 6.

13. The method of claim 11, wherein P is less than 8.

14. The method of claim 13, wherein the step of amplifying is done using capacitors having a matching tolerance of about 1%.

15. A cyclic analog-to-digital converter, comprising:
    means for digitizing either an input signal or an amplified feedback residue signal to produce first digital signals;
    means for producing N-bits of digital information based on the first digital signals over N consecutive cycles, where N is a positive integer; and
    means for amplifying a residue signal to produce the amplified feedback residue signal, wherein for at least M cycles, the means for amplifying uses a capacitor averaging technique, where M is a positive integer and less than N, and wherein for P cycles, the means for amplifying uses a gain amplification technique, where P is a positive integer and less than N.

16. The converter of claim 15, wherein the P cycles are used to produce the least significant bits of the N-bits of digital information.

17. The converter of claim 16, wherein P is greater than 4.

18. The converter of claim 17, wherein P is at least 6.

19. The converter of claim 17, wherein P is less than 8.

20. The converter of claim 19, wherein the means for amplifying incorporates capacitors having a matching tolerance of about 1%.

* * * * *